United States Patent
Lee et al.

(10) Patent No.: US 9,548,105 B1
(45) Date of Patent: Jan. 17, 2017

(54) ENHANCED POST-WRITE READ FOR 3-D MEMORY

(71) Applicant: SanDisk Technologies Inc., Plano, TX (US)

(72) Inventors: Aaron Lee, Milpitas, CA (US); Mrinal Kochar, Milpitas, CA (US); Yew Yin Ng, Milpitas, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/927,134

(22) Filed: Oct. 29, 2015

(51) Int. Cl.
| | |
|---|---|
| *G11C 16/06* | (2006.01) |
| *G11C 11/419* | (2006.01) |
| *G11C 16/04* | (2006.01) |
| *G11C 16/34* | (2006.01) |

(52) U.S. Cl.
CPC ......... *G11C 11/419* (2013.01); *G11C 16/0483* (2013.01); *G11C 16/3454* (2013.01); *G11C 16/3459* (2013.01)

(58) Field of Classification Search
CPC .................................................. G11C 16/3459
USPC ....................................................... 365/185.22
See application file for complete search history.

(56) References Cited

U.S. PATENT DOCUMENTS

| | | | |
|---|---|---|---|
| 8,423,866 B2 | 4/2013 | Dusija et al. | |
| 8,726,104 B2 * | 5/2014 | Sharon | G06F 11/1048 714/704 |
| 2012/0201077 A1 * | 8/2012 | Nagao | G11C 16/3459 365/185.22 |
| 2015/0003156 A1 | 1/2015 | Berckmann et al. | |
| 2015/0100851 A1 | 4/2015 | Bhalerao et al. | |

* cited by examiner

*Primary Examiner* — Son Mai
(74) *Attorney, Agent, or Firm* — Brinks Gilson & Lione

(57) ABSTRACT

Apparatus and method for performing a post-write read in a memory device are disclosed. A memory device may include 3-dimensional memory, with the wordlines in a memory block each having multiple strings. Periodically, the memory device may analyze the wordlines for defects by performing a post-write read on a respective wordline and analyzing the read data to determine whether the respective wordline is defective. Rather than reading all of the strings for the respective wordline, less than all of the strings (such as only one of the strings) for the respective wordline are read. In this way, determining whether the respective wordline in 3-dimensional memory may be performed more quickly.

24 Claims, 8 Drawing Sheets

ENHANCED POST-WRITE READ FOR 3-D MEMORY

TECHNICAL FIELD

This application relates generally to storage devices. More specifically, this application relates to Enhanced Post-Write Reads (EPWRs) for 3-D memory in a storage device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A memory device includes a memory device controller and non-volatile memory (such as in the form of one or more memory integrated circuit chips) in communication with the memory device controller. The non-volatile memory may be composed of memory cells that can be programmed to store a single bit or a single level, being termed a single-level cell (SLC), whereas other memory cells in the non-volatile memory may be programmed to store multiple bits or multiple levels, being termed multi-level cells (MLC).

In one operation, data stored in an SLC block may be folded into an MLC block. In this regard, data may be folded into a target MLC block of the solid state memory, such as when data is moved from one or more source SLC blocks to the target MLC block. In the folding process, errors may occur whereby the data stored in the target MLC block contains differences in the values as compared to the values stored in the source SLC blocks. To identify errors, an enhanced post-write read (EPWR) may be performed whereby the values stored in the target MLC block may be read and compared with the values stored in the source SLC blocks to identify the errors.

BRIEF DESCRIPTION OF THE DRAWINGS

The system may be better understood with reference to the following drawings and description. In the figures, like reference numerals designate corresponding parts throughout the different views.

DETAILED DESCRIPTION

Figure 1A:
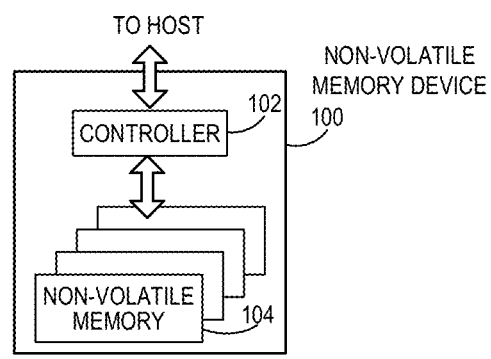
FIG. 1A is a block diagram of an example non-volatile memory device.

A memory device may include a memory device controller and memory. The memory may be in the form of one or more memory integrated circuit chips. The memory device may receive data from a host device, instructing the memory device to store the data in the memory. In response thereto, the memory device controller may send one or more commands to the memory integrated circuit chip(s) in order for the data to be written into the memory.

As discussed in more detail below, the memory may comprise volatile memory and non-volatile memory. The non-volatile memory may comprise non-volatile memory cells in which the data may be stored. In one embodiment, the non-volatile memory cells can take the form of solid-state (e.g., flash) memory cells and can be one-time programmable, few-time programmable, or many-time programmable. Further, the non-volatile memory cells may be programmed to store a single level (e.g., a logic "0" or a logic "1"), termed single-level cells (SLC). Alternatively, the non-volatile memory cells may be programmed to store more than a single level (e.g., a logic "00", a logic "01", a logic "10", or a logic "11"), termed multi-level cells (MLC). Examples of MLC include double-level cells (DLC), triple-level cells (TLC), quadruple-level cells (QLC), etc.

There are several examples of writing data to non-volatile memory. One example is folding, whereby data is first stored in SLC and then folded into MLC. Other examples of movement of data in non-volatile memory are contemplated. In this regard, discussion herein regarding folding may likewise be applied to the other examples of movement of data in the non-volatile memory.

In one particular example, the folding process may comprise performing an on-chip copy of data from three SLC blocks to one destination MLC block whereby the transfer of data from the 1 bit (2 states) per cell of the SLC blocks to the higher density 3 bit (8 states) per cell arrangement of the destination MLC block. As is generally understood, binary flash memory cells can have two possible states (0 or 1) that represent 1 bit of information. For a given total operating voltage range available in a cell, the states of a binary cell can be represented by voltage levels above or below a reference voltage set halfway between the maximum and minimum voltage of the range. MLC memory cells, which may have the same physical configuration as a binary cell, need to partition their operating voltage range into finer increments to allow for discernable peaks at each desired state. For a three bit per cell MLC arrangement, a distribution of detectable eight states (000, 001, 010, 011, 100, 101, 110, 111) is fit into the same voltage range that the binary memory cell can use for just two states.

However, during a folding operation where data stored in one or more source SLC blocks is to be copied to a destination MLC block, an error event may occur that results in only some of the data being successfully written to the destination MLC block. One cause of an error event may be a defect in the memory. In this regard, after folding, the memory device may determine whether the data has been folded correctly, and in turn determine whether there is a defect in the memory (e.g., in a wordline (WL) or string, as discussed in more detail below).

Defects in wordlines and/or strings may be due to one of several causes. For example, wordline defects may be initial defects that are formed during manufacturing of a NAND flash memory (e.g., wordline short or open defects). Other examples of wordline defects include hard shorts that prevent the appropriate biasing of wordline voltages, power-ground shorts, or the number of initial defects is greater than a threshold. Regardless, the wordline defects may be identified, such as by enhanced post-write read (EPWR), discussed in more detail below, and an identification of incomplete memory blocks and corresponding defective wordlines may be written to a defective wordline list stored in a reserved memory partition.

In one embodiment, an enhanced post-write read (EPWR) is performed in which data is read from the target block after the data was written to the target block in order to verify that the data was correctly written to the target block. Based on the read, an error rate of the target block may be determined. For example, the error rate of the block may be a fail bit count. The fail bit count may be a number of bits that differ between data written to the target block and data subsequently read from the target block. More generally, the determined error rate may be any indication of how much of the target block failed to retain data stored in the target block. Alternatively or in addition, the determined error rate may be any indication of a portion of the target block that failed to retain data stored in the target block. For example, the determined error rate may be a percentage, a fraction, a number of pages, a number of bytes, a number of bits, or any other indication of the portion of the target block that failed to retain data stored in the target block.

In one embodiment, all of the cells in a respective wordline are read when performing EPWR. For example, 2-dimensional memory, all the cells on a respective wordline are read in order to determine, based on the EPWR, whether there is a defect in the respective wordline. In an alternate embodiment, less than all of the cells in a respective wordline are read when performing EPWR. As discussed in more detail below, in 3-dimensional memory, a respective wordline may have multiple strings. In performing the EPWR, less than all of the strings for the respective wordline are read in determining the error rate of the respective wordline, and in turn whether the respective wordline has a defect. For example, a wordline may have 4 strings, as discussed in more detail below. Less than all of the strings, such as only 1 of the 4 strings, for the respective wordline are read in order to determine the error rate of the respective wordline and whether the respective wordline is defective. In this way, performing EPWR may take less time since less than all of the strings are read. For example, the EPWR for each wordline takes 60 milliseconds. By limiting the number of EPWRs performed to fewer than all of the strings, overhead may be reduced.

Further, the strings read in a block of MLC may follow a predetermined sequence. As discussed in more detail below with respect to FIG. 4, a block may include 47 wordlines and 4 strings. EPWR may read each of the 47 wordlines, with a predetermined sequence of strings read for the 47 wordlines. In one embodiment, the strings selected for read may be sequential, such as reading string 0 for wordline 0, string 1 for wordline 1, string 2 for wordline 2, string 3 for wordline 3, string 0 for wordline 4, string 1 for wordline 5, string 2 for wordline 6, string 3 for wordline 7, etc. In this way, the strings read may follow a certain sequence (string 0, string 1, string 2, and string 3), and may repeat.

Likewise, in order to determine whether a respective string is defective, fewer than all of wordlines for the respective string are read. In the example discussed above of 47 wordlines and 4 strings, string 0 is read for wordlines 0, 4, 8, 12, 16, 20, 24, 28, 32, 36, 40, and 44. Thus, fewer than all of the strings for each of the wordlines are read. Further, the reads for the subset of a respective strings may be analyzed to determine whether the respective string is defective. In one embodiment, if the number of wordlines for a respective string have a determined error rate or greater, the respective string is deemed defective. In the given example, the reads of wordlines 0, 4, 8, 12, 16, 20, 24, 28, 32, 36, 40, and 44 may be analyzed to determine whether string 0 is defective. If more than 2 of the read wordlines have a determined error rate or greater, string 0 is deemed defective. In this way, Referring to the figures, FIG. 1A is a block diagram illustrating a non-volatile memory device. The non-volatile memory device 100 includes a controller 102 and non-volatile memory that may be made up of one or more non-volatile memory die 104. The non-volatile memory die may comprise one or more memory integrated circuit chips. One or both of the controller 102 and non-volatile memory die 104 may use a regulated voltage. As used herein, the term die refers to the set of non-volatile memory cells, and associated circuitry for managing the physical operation of those non-volatile memory cells, that are formed on a single semiconductor substrate. Controller 102 interfaces with a host system and transmits command sequences for read, program (e.g., write), and erase operations to non-volatile memory die 104.

The controller 102 (which may in one embodiment be a flash memory controller) can take the form of processing circuitry, a microprocessor or processor, and a computer-readable medium that stores computer-readable program code (e.g., software or firmware) executable by the (micro) processor, logic gates, switches, an application specific integrated circuit (ASIC), a programmable logic controller, and an embedded microcontroller, for example. The controller 102 can be configured with hardware and/or firmware to perform the various functions described below and shown in the flow diagrams. For example, the hardware and/or firmware may be configured for analysis of the incoming data stream (such as for bandwidth and/or consistency) and for determination whether to use hybrid blocks, as discussed in more detail below. Also, some of the components shown as being internal to the controller can also be stored external to the controller, and other components can be used. Additionally, the phrase "operatively in communication with" could mean directly in communication with or indirectly (wired or wireless) in communication with through one or more components, which may or may not be shown or described herein.

As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

Non-volatile memory die 104 may include any suitable non-volatile storage medium, including NAND flash memory cells and/or NOR flash memory cells. One example of non-volatile memory die 104 may comprise a memory integrated circuit chip. The memory cells can take the form of solid-state (e.g., flash) memory cells and can be one-time programmable, few-time programmable, or many-time programmable. As discussed above, the memory cells can also be single-level cells (SLC), double-level cells (MLC), triple-level cells (TLC), quadruple-level cells (QLC), or use other memory cell level technologies, now known or later developed. Also, the memory cells can be fabricated in a two-dimensional or three-dimensional fashion.

The interface between controller 102 and non-volatile memory die 104 may be any suitable flash interface, such as Toggle Mode 200, 400, or 800. In one embodiment, memory device 100 may be a card based system, such as a secure digital (SD) or a micro secure digital (micro-SD) card. In an alternate embodiment, memory device 100 may be part of an embedded memory device.

Although in the example illustrated in FIG. 1A non-volatile memory device 100 includes a single channel between controller 102 and non-volatile memory die 104, the subject matter described herein is not limited to having a single memory channel. For example, in some NAND memory device architectures such as illustrated in FIGS. 1B-C, 2, 4, 8 or more NAND channels may exist between the controller and the NAND memory device, depending on controller capabilities. In any of the embodiments described herein, more than a single channel may exist between the controller and the memory die, even if a single channel is shown in the drawings.

Figure 1B:
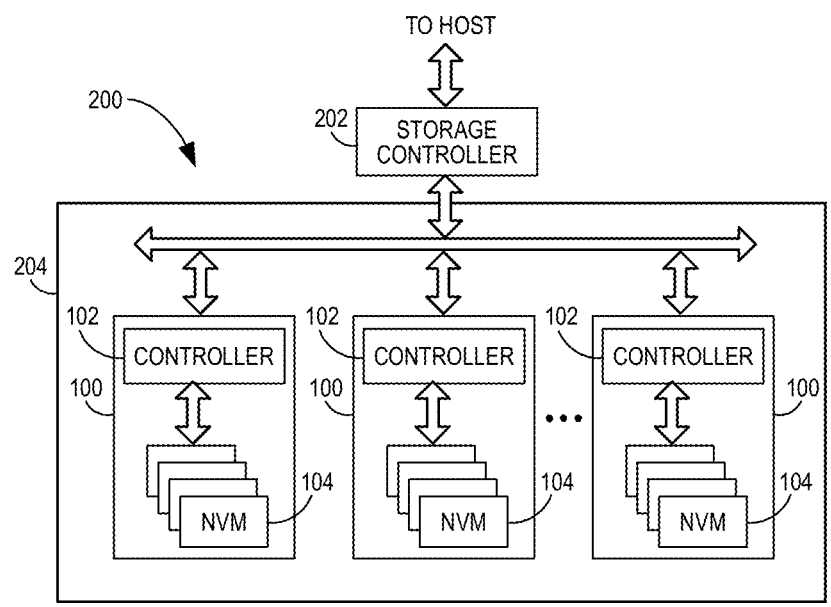
FIG. 1B is a block diagram illustrating an exemplary storage module.

FIG. 1B illustrates a storage module 200 that includes plural non-volatile memory devices 100. As such, storage module 200 may include a storage controller 202 that interfaces with a host and with storage system 204, which includes a plurality of non-volatile memory devices 100. The interface between storage controller 202 and non-volatile memory devices 100 may be a bus interface, such as a serial advanced technology attachment (SATA) or peripheral component interface express (PCIe) interface. Storage module 200, in one embodiment, may be a solid state drive (SSD), such as found in portable computing devices, such as laptop computers, and tablet computers.

Figure 1C:
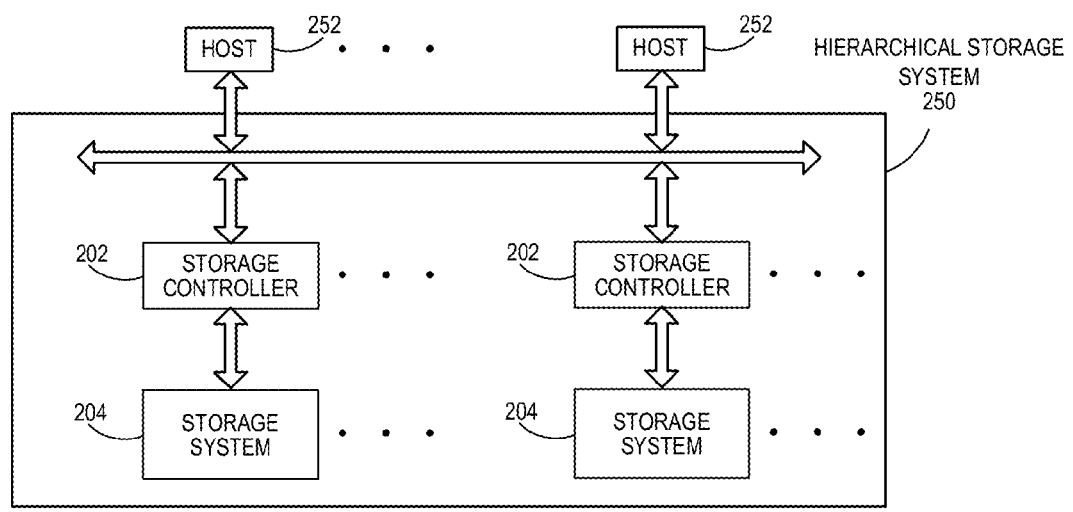
FIG. 1C is a block diagram illustrating a hierarchical storage system.

FIG. 1C is a block diagram illustrating a hierarchical storage system. A hierarchical storage system 210 includes a plurality of storage controllers 202, each of which controls a respective storage system 204. Host systems 212 may access memories within the hierarchical storage system via a bus interface. In one embodiment, the bus interface may be a non-volatile memory express (NVMe) or a fiber channel over Ethernet (FCoE) interface. In one embodiment, the system illustrated in FIG. 1C may be a rack mountable mass storage system that is accessible by multiple host computers, such as would be found in a data center or other location where mass storage is needed.

Figure 2A:
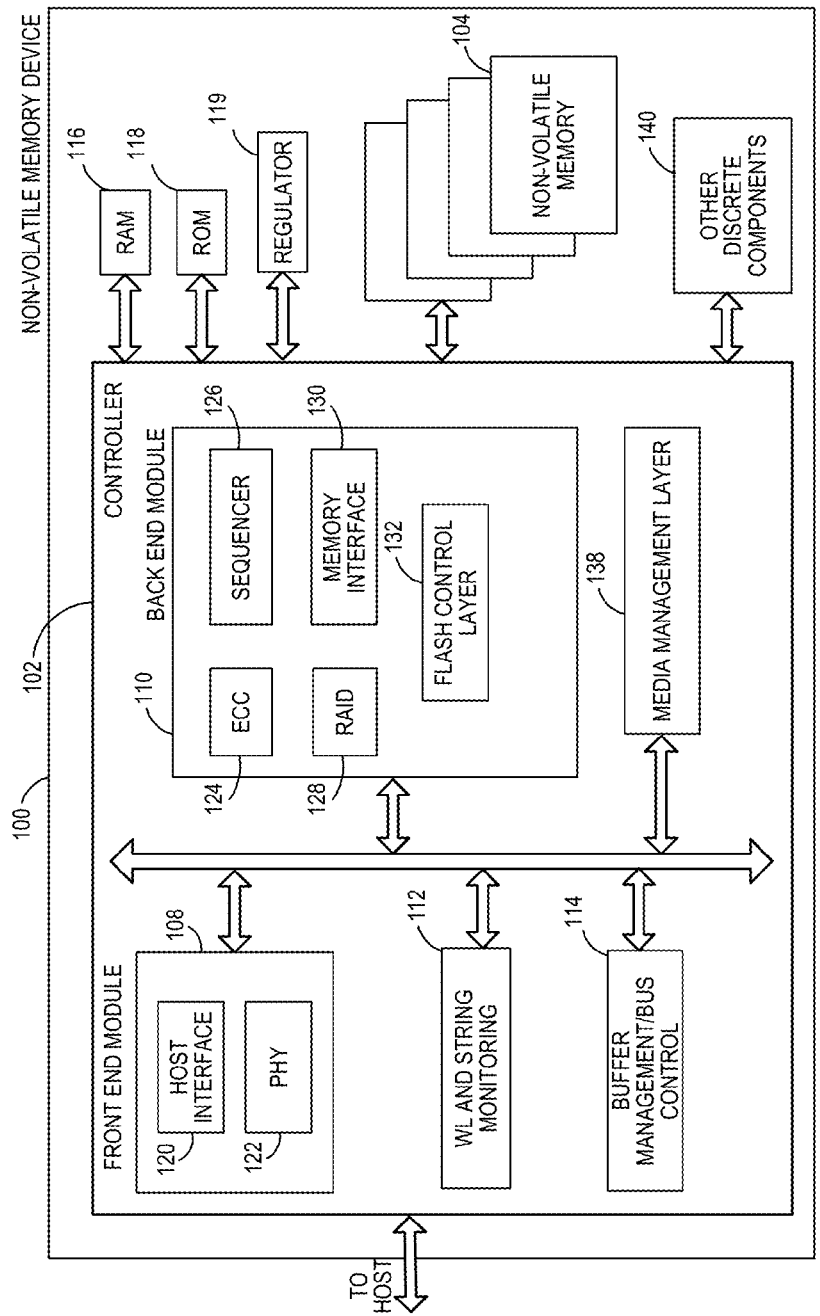
FIG. 2A is a block diagram illustrating exemplary components of a controller of a non-volatile memory device.

FIG. 2A is a block diagram illustrating exemplary components of controller 102 in more detail. Controller 102 includes a front end module 108 that interfaces with a host, a back end module 110 that interfaces with the one or more non-volatile memory die 104, and various other modules that perform functions which will now be described in detail.

A module may take the form of a packaged functional hardware unit designed for use with other components, a portion of a program code (e.g., software or firmware) executable by a (micro)processor or processing circuitry that usually performs a particular function of related functions, or a self-contained hardware or software component that interfaces with a larger system, for example.

Modules of the controller 102 may include a wordline (WL) and string monitoring module 112. As explained in more detail below, the WL and string monitoring module 112 may receive information from the non-volatile memory 104 as to which wordlines and/or strings are defective within non-volatile memory 104. In the embodiment whereby non-volatile memory 104 is in the form of multiple memory integrated circuit chips, the WL and string monitoring module 112 may receive communications from the multiple memory integrated circuit chips indicating which wordlines and/or strings on a respective memory integrated circuit chip are defective. In turn, the WL and string monitoring module 112 may monitor which wordlines and strings are defective on the multiple memory integrated circuit chips to determine, for example, a total amount of non-defective non-volatile memory available.

While in some implementations the WL and string monitoring module 112 may be part of the controller 102, in other implementations, all or a portion of the WL and string monitoring module 112 may be separate from the controller 102, that interface with the controller 102.

Referring again to modules of the controller 102, a buffer manager/bus controller 114 manages buffers in random access memory (RAM) 116 and controls the internal bus arbitration of controller 102. A read only memory (ROM) 118 stores system boot code. Although illustrated in FIG. 2A as located separately from the controller 102, in other embodiments one or both of the RAM 116 and ROM 118 may be located within the controller. In yet other embodiments, portions of RAM and ROM may be located both within the controller 102 and outside the controller. Further, in some implementations, the controller 102, RAM 116, and ROM 118 may be located on separate semiconductor die.

Front end module 108 includes a host interface 120 and a physical layer interface (PHY) 122 that provide the electrical interface with the host or next level storage controller. The choice of the type of host interface 120 can depend on the type of memory being used. Examples of host interfaces 120 include, but are not limited to, SATA, SATA Express, SAS, Fibre Channel, USB, PCIe, eMMC I/F, and NVMe. The host interface 120 typically facilitates transfer for data, control signals, and timing signals.

Back end module 110 includes an error correction controller (ECC) engine 124 that encodes the data bytes received from the host, and decodes and error corrects the data bytes read from the non-volatile memory. A command sequencer 126 generates command sequences, such as program and erase command sequences, to be transmitted to non-volatile memory die 104. A RAID (Redundant Array of Independent Drives) module 128 manages generation of RAID parity and recovery of failed data. The RAID parity may be used as an additional level of integrity protection for the data being written into the non-volatile memory device 100. In some cases, the RAID module 128 may be a part of the ECC engine 124. A memory interface 130 provides the command sequences to non-volatile memory die 104 and receives status information from non-volatile memory die 104. In one embodiment, memory interface 130 may be a double data rate (DDR) interface, such as a Toggle Mode 200, 400, or 800 interface. A flash control layer 132 controls the overall operation of back end module 110.

Additional components of system 100 illustrated in FIG. 2A include media management layer 138, which performs wear leveling of memory cells of non-volatile memory die 104. System 100 also includes other discrete components 140, such as external electrical interfaces, external RAM, resistors, capacitors, or other components that may interface with controller 102.

In alternative embodiments, one or more of the physical layer interface 122, RAID module 128, media management layer 138 and buffer management/bus controller 114 are optional components that are not necessary in the controller 102.

Figure 2B:
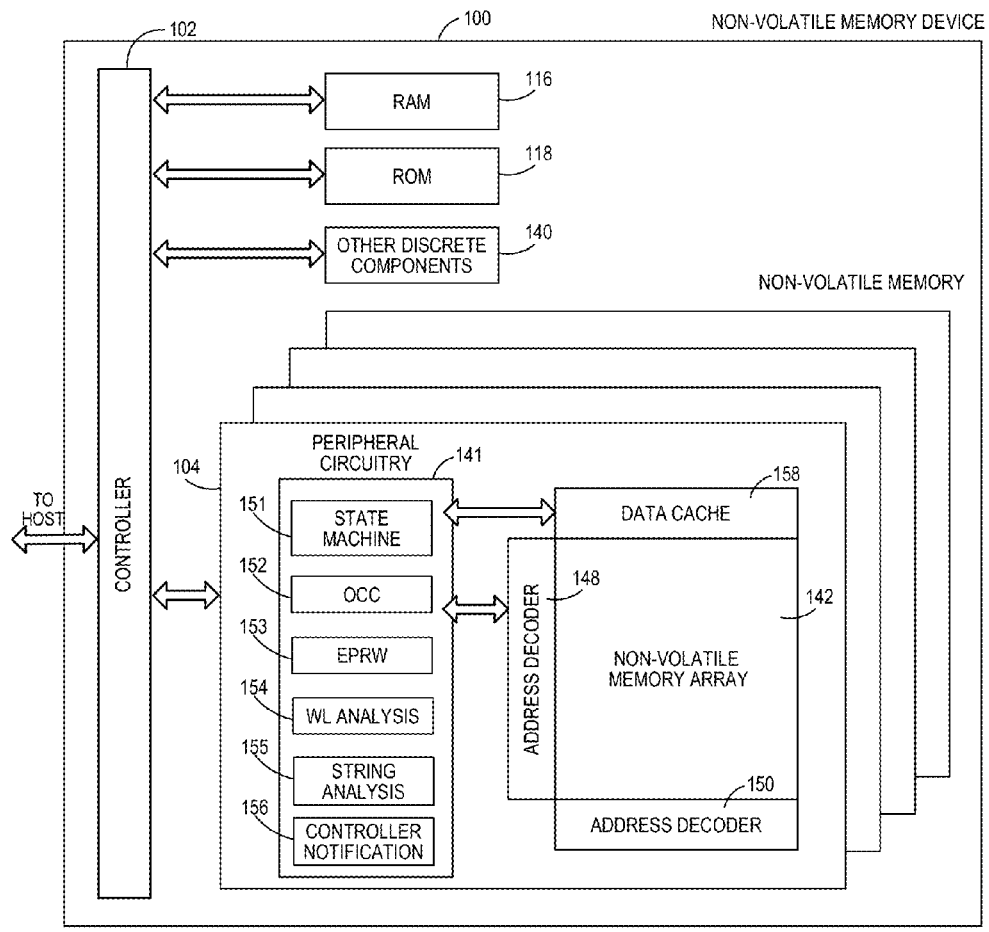
FIG. 2B is a block diagram illustrating exemplary components of a non-volatile memory of a non-volatile memory device.

FIG. 2B is a block diagram illustrating exemplary components of non-volatile memory die 104 in more detail. Non-volatile memory die 104 includes peripheral circuitry 141 and non-volatile memory array 142. Non-volatile memory array 142 includes the non-volatile memory cells used to store data. The non-volatile memory cells may be any suitable non-volatile memory cells, including NAND flash memory cells and/or NOR flash memory cells in a two dimensional and/or three dimensional configuration. Peripheral circuitry 141 includes a state machine 151 that provides status information to controller 102.

Non-volatile memory die may further include on-chip copy (OCC) module 152. OCC module 152 is configured to perform an on-chip copy of data from one portion of memory within a respective memory chip to another portion of memory within the respective memory chip. For example, OCC module 152 may perform the folding of data from SLC blocks into an MLC block.

In this regard, OCC module 152 may be any component that folds data into a target block of the storage memory within non-volatile memory 104. Data may be considered to be folded into the target block when the data is moved from one or more source blocks elsewhere in the storage memory to the target block. Thus, during a folding, OCC module 152 may move the data from the source blocks to the target block. Further, the folding, from one or more source SLC blocks to one or more MLC blocks may increase availability of single-level cell flash memory. OCC module 152 may perform the folding in response to one or more events, such as for example, a garbage collecting event, a wear leveling event, or any other type of event in which data is copied and/or moved to the target block.

Non-volatile memory die may further include EPWR module 153. EPWR module 153 may be any component that performs an enhanced post-write read (EPWR). The EPWR may be any operation that reads data from the storage memory within non-volatile memory 104 after the data was written to the storage memory in order to verify that the data was correctly written to the storage memory.

Non-volatile memory die may further include WL analysis module 154 and string analysis module 155. As discussed in more detail below, WL analysis module 154 and string analysis module 155 may analyze the results from EPWR module 153 in order to determine whether there are any defects in wordlines or strings, respectively. Finally, controller notification module 156 may receive communications from WL analysis module 154 and string analysis module 155 indicating the wordlines and strings determined defective in order for the controller notification module 156 to send a communication to controller 102. As discussed above, WL and string monitoring module 112 may receive the communication from the controller notification module 156 and compile a defective wordline and/or string list.

Non-volatile memory die 104 further includes address decoders 148, 150 for addressing within non-volatile memory array 142, and a data cache 156 that caches data.

Figure 3:
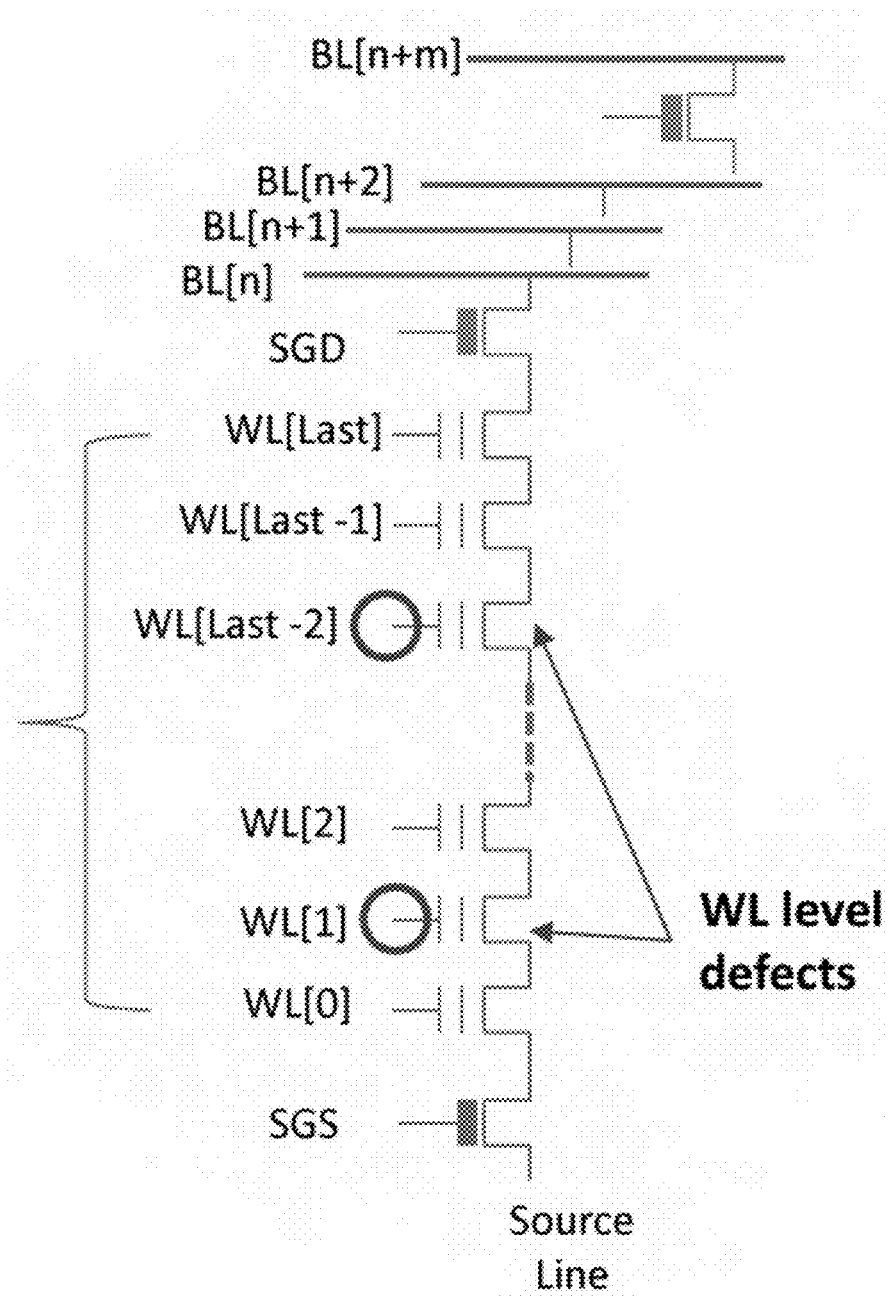
FIG. 3 illustrates EPWR for a 2-dimensional NAND memory.

FIG. 3 illustrates EPWR for a 2-dimensional NAND memory. FIG. 3 shows wordlines (WL) 0 to Last. In one example, there are 47 wordlines; however, fewer or greater numbers of wordlines are contemplated. Further, FIG. 3 illustrates SGS (select gate source) and SGD (select gate drain), used to select the particular string illustrated in FIG. 3. FIG. 3 further illustrates bitlines (BL) n to n+m. In one example, there are 16K bitlines; however, fewer or greater numbers of bitlines are contemplated. Thus, each wordline may include 16K cells, each of which corresponding to one of the bitlines. Further, in operation, the values from the 16K cells may be output to or (read into from) the bitlines by activating the particular wordline and the SGS and SGD. Finally, FIG. 3 illustrates that wordline defects are present in wordlines 1 and Last−2.

Figure 4:
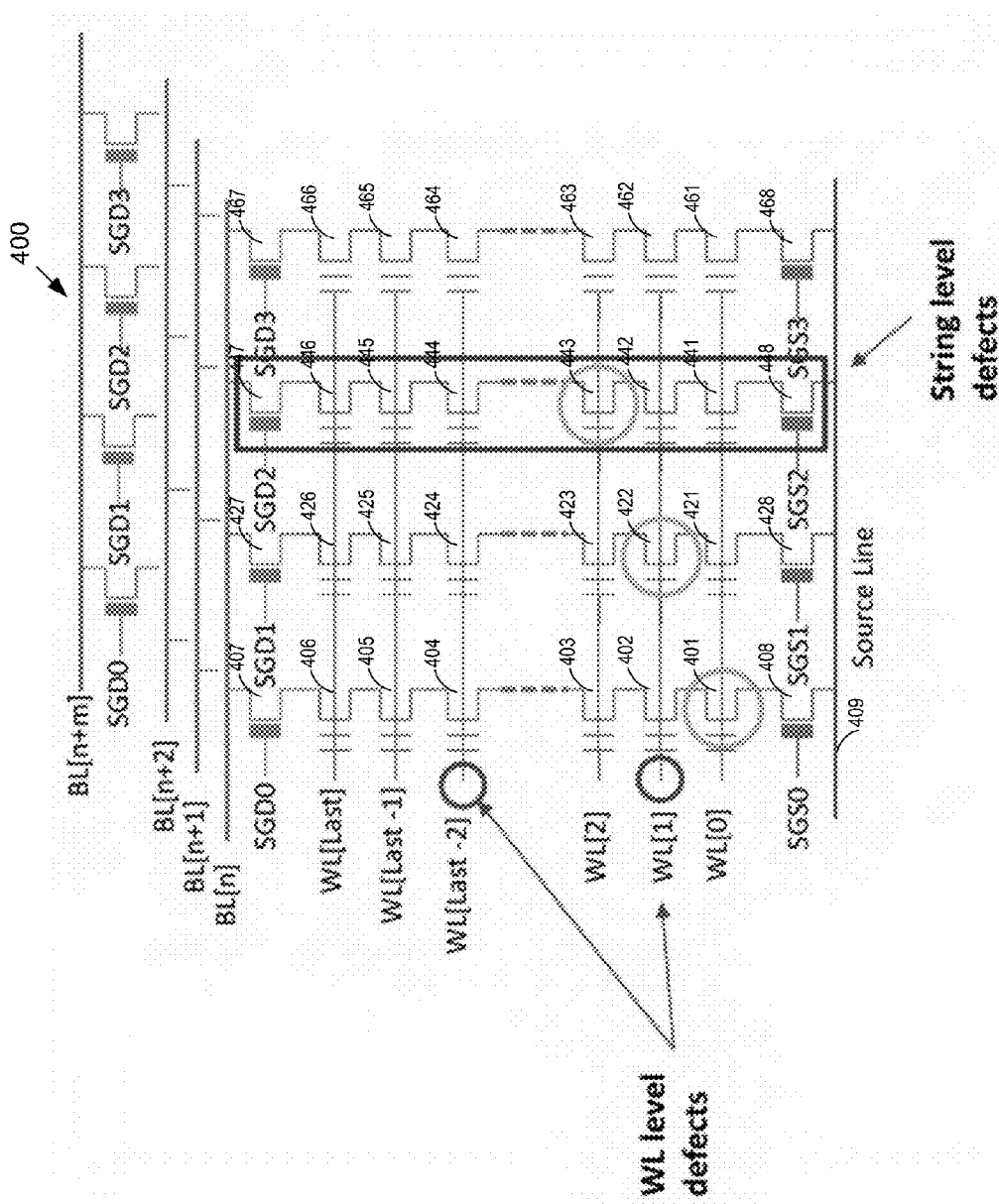
FIG. 4 illustrates EPWR for a 3-dimensional NAND memory.

FIG. 4 illustrates EPWR for a 3-dimensional NAND memory. Similar to FIG. 3, FIG. 4 illustrates multiple wordlines, shown as wordlines (WL) 0 to Last, and multiple bitlines, shown as bitlines (BL) n to n+m. Further, FIG. 4 illustrates multiple select gates source/drain corresponding to different strings. For example, FIG. 4 illustrates 4 strings, each with a corresponding SGS and SGD, such as SGS0/SGD0 for string 0; SGS1/SGD1 for string 1; SGS2/SGD2 for string 2; and SGS3/SGD3 for string 3. Thus, FIG. 4 illustrates one type of NAND flash memory structure, in which multiple floating-gate transistors are arranged in series with and between two select gates. The floating-gate transistors in series and the select gates (such as SGS and SGD) may be referred to as a NAND string.

FIG. 4 depicts multiple strings, with each string being depicted with six transistors in series between a first select gate (i.e., a drain-side select gate) and a second select gate (i.e., a source-side select gate). For example, string 0 includes transistors 401-406 between SGD0 and SGS0, string 1 includes transistors 421-426 between SGD1 and SGS1, string 2 includes transistors 441-446 between SGD2 and SGS2, and string 3 includes transistors 461-466 between SGD3 and SGS3. Although FIGS. 3-4 show six floating-gate transistors in the string, the use of six floating-gate transistors is only provided as an example. A string may have less than or more than six floating-gate transistors (or memory cells). For example, some NAND strings may include 16 memory cells, 32 memory cells, 64 memory cells, 128 memory cells, etc. The discussion herein is not limited to any particular number of memory cells in a string.

The respective select gate (e.g., SGD0, SGD1, SGD2, and SGD3) connects the respective string to a bit line. Further, the respective select gate (e.g., SGS0, SGS1, SGS2, and SGS3) connects the respective string to a source line 409. The respective select gate (e.g., SGD0, SGD1, SGD2, and SGD3) is controlled by applying the appropriate voltage to a control gate (e.g., via select line SGD of FIG. 4). Likewise, the respective select gate (e.g., SGS0, SGS1, SGS2, and SGS3) is controlled by applying the appropriate voltage to a control gate (e.g., via select line SGS of FIG. 4). Each of the transistors 401-406, 421-426, 441-446, and 461-466 includes a control gate and a floating gate. Control gates may be connected to wordlines WL[0], WL[1], WL[2], . . . WL[Last−2], WL[Last−1], WL[Last], respectively.

As discussed in more detail below, analysis of the data generated from EPWR may determine whether a specific wordline or a specific string is defective. As illustrated in FIG. 4, wordline defects are present in wordlines 1 and Last−2, and string defects are present in string 2.

Thus, when specific transistors (or cells) within a string is read or is verified during programming, its control gate is supplied with an appropriate voltage. At the same time, the rest of the non-addressed transistors (or cells) in the string are fully turned on by application of sufficient voltage on their control gates. In this way, a conductive path is effectively created from the source of the individual transistor to the source terminal of the string and likewise for the drain of the individual transistor to the drain terminal of the cell.

As discussed above, an EPWR may be performed. The EPWR may read one, some or all of the wordlines. In the examples depicted in FIGS. 3-4, in one embodiment, all of WL[0] to WL [Last] may be read. Further, some or all of the cells within a wordline may be read. In the example depicted in FIG. 3, all of the cells within a respective wordline may be read. In particular, it takes approximately 60 milliseconds for each EPWR (regardless of whether some or all of the cells within a respective wordline are read).

With regard to FIG. 3, in one embodiment, each of the wordlines may be read in performing the EPWR. The data generated from the EPWR may then be used to analyze whether any of the wordlines are defective.

With regard to FIG. 4, in one embodiment, each of the wordlines (e.g., WL[0] . . . WL[Last]) may be read. Further, rather than reading each of the strings (such as string 0, string 1, string 2, and string 3), in one embodiment, fewer than all of the strings are read for a respective wordline. In a more specific embodiment, only one of the strings is read for a respective wordline.

The string selected for a respective wordline may, in one embodiment, be determined based on a preset sequence. For example, FIG. 4 illustrates a sequence whereby the strings for respective wordlines are selected in the following sequence: string 0, string 1, string 2, string 3 (and then repeating the sequence). In this regard, if the wordlines are selected in sequence (e.g., WL[0], WL[1], WL[2], . . . WL[Last−2], WL[Last−1], WL[Last]), the strings are selected as illustrated in FIG. 4. Alternatively, if the wordlines are not selected in sequence, the strings assigned are in a different order. For example, if the wordlines are selected in reverse sequence (e.g., WL[Last], WL[Last−1], WL[Last−2] . . . WL[2], WL[1], WL[0]), the strings may be assigned in a same sequence (string 0, string 1, string 2, string 3) such that string 0 is read from WL[Last], string 1 is read from WL[Last−1], string 2 is read from WL[Last−2], and so on.

As discussed in more detail below, the data resulting from the EPWR may be used to determine whether there is an error in a respective wordline. Further, since fewer than all of the strings are read in order to determine whether there is an error in the wordline, the EPWR may be performed more quickly.

Figure 5:
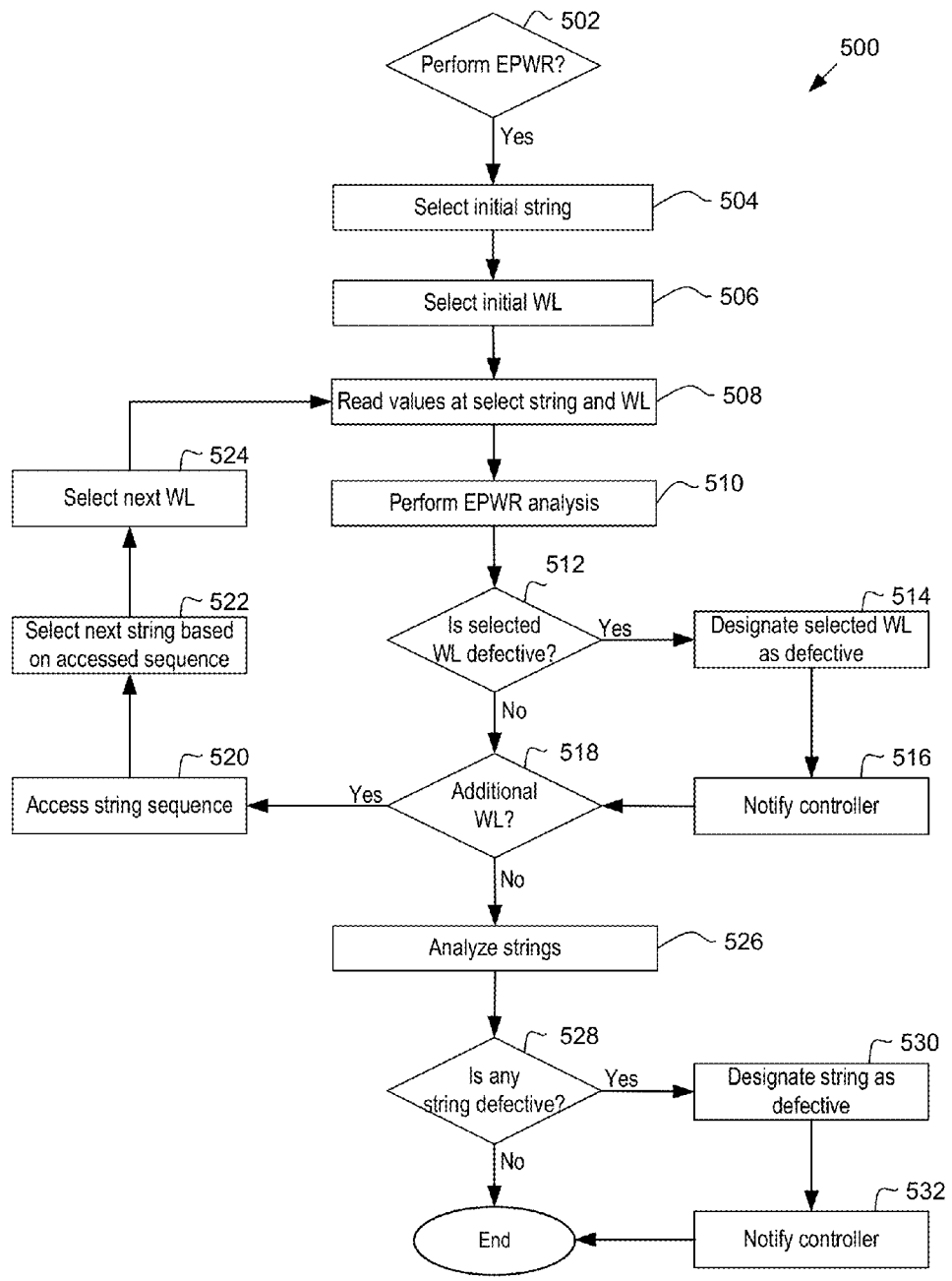
FIG. 5 illustrates a flow chart for EPWR in a 3-dimensional NAND memory.

FIG. 5 illustrates a flow chart 500 for EPWR in a 3-dimensional NAND memory. At 502, it is determined whether to perform an EPWR. The determination may be triggered by one or more events, such as the folding of data from SLC blocks to an MLC block. In response to determining to perform EPWR, at 504, the initial string is selected. As discussed above, the strings may be selected in sequence. Thus, the initial selection of the string may be based on the sequence. For example, as depicted in FIG. 4, string 0 may be selected as the initial string.

Further, at 506, the initial wordline is selected. Similar to strings, the wordlines may be selected in sequence. Thus, the initial selection of the wordline may be based on the sequence. For example, as depicted in FIG. 4, WL[0] may be selected as the initial wordline. Though FIG. 5 illustrates that the initial string is selected prior to the initial wordline, the converse may likewise be performed.

At 508, the values are read for the selected string and wordline. At 510, EPWR analysis is performed. Examples of EPWR analysis are discussed below. At 512, based on the EPWR analysis, it is determined whether the selected wordline is defective. If so, at 514, the selected wordline is designated as defective, and at 516, a notification of the designated defective wordline is sent to the controller.

At 518, it is determined whether there are additional wordlines to analyze. If so, at 520, the string sequence is accessed, and at 522, the next string is selected based on the accessed sequence. As discussed above, the string sequence may, for example, comprise string 0, string 1, string 2, and string 3. In this regard, the next string for selection may be based on the sequence and the present string (e.g., if the current string selected is string 1, the next string for selection is string 2). At 524, the nest wordline is selected. After which, flow chart 500 loops back to 508.

If there are no additional wordlines, at 526, the data generated from EPWR is analyzed with respect to the strings. At 528, based on the string analysis, it is determined whether any string is defective. If so, at 530, the string is designated as defective, and at 532, a notification of the defective string is sent to the controller.

As discussed above, the data generated from EPWR may be used to determine whether a specific wordline and/or a specific string is defective. With regard to a specific wordline, the data generated from EPWR may be used to determine the error rate in copying the data to the specific wordline. As discussed above, the data generated from EPWR is for less than all of the strings associated with the specific wordline (such as only 1 of the strings associated with the specific wordline). In this regard, the analysis may focus on a subset of data with regard to the specific wordline (namely the data generated from EPWR for the 1 string associated with the specific wordline) and, based on the analysis of the subset of data, determine the error rate. The error rate for the subset of data may be compared with a predetermined error rate. In response to determining that the determined error rate for the specific wordline is greater than the predetermined error rate, the specific wordline (including all of the strings associated with the specific wordline) may be deemed defective.

Likewise, with regard to a specific string, the data generated from EPWR may be used to determine whether the specific string is defective. As discussed above, the data generated from EPWR is for less than all of the strings associated with the wordlines. In the example of FIG. 4, less than all of the wordlines for a specific string are read. For example, the wordlines for string 0 are WL[0], WL[4], WL[8], etc. In this regard, the analysis to determine whether a specific string is defective may focus on a subset of data with regard to the wordlines (namely the data generated from EPWR for the 1 string associated with less than all of the wordlines) and, based on the analysis of the subset of data, determine whether the specific string is defective. In one embodiment, the determination as to whether a specific string is defective may be based on whether the wordlines, that use the data generated from the specific string, are likewise determined defective. As discussed above, in the example of FIG. 4, the wordlines for string 0 are WL[0], WL[4], WL[8], etc. Thus, for a memory that has 47 wordlines, a total of 12 wordlines are read for string 0. In this situation, the number of the wordlines, from the set of 12 wordlines are read for string 0, that are deemed defective is compared with a predetermined number. If the number of defective wordlines is greater than the predetermined number, the specific string is deemed defective. For example, the predetermined number may be 2, such that if the number of wordlines that are read for string 0 is greater than 2, then string 0 is deemed defective.

In the present application, semiconductor memory devices such as those described in the present application may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and wordlines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is intended that the foregoing detailed description be understood as an illustration of selected forms that the invention can take and not as a definition of the invention. It is only the following claims, including all equivalents, that are intended to define the scope of the claimed invention. Finally, it should be noted that any aspect of any of the preferred embodiments described herein can be used alone or in combination with one another.

What is claimed is:

1. A non-volatile memory device comprising:
    post-write read circuitry configured to perform a post-write read on a respective wordline of less than all of a plurality of strings for the respective wordline; and
    wordline analysis circuitry configured to determine whether the respective wordline in the non-volatile memory device is defective based on the post-write read on the respective wordline of less than all of the plurality of strings for the respective wordline.

2. The non-volatile memory device of claim 1, further comprising string analysis circuitry configured to determine whether the plurality of strings in the non-volatile memory device are defective.

3. The non-volatile memory device of claim 2, wherein the post-write read circuitry is configured to perform the post-write read on a plurality of respective wordlines, at least two of the respective wordlines reading a same string; and
    wherein the string analysis circuitry configured to determine whether the same string in the non-volatile memory device is defective based on the post-write read on the at least two of the respective wordlines reading the same string.

4. The non-volatile memory device of claim 3, wherein the post-write read circuitry is configured to perform the post-write read on the plurality of wordlines using a pre-defined string sequence.

5. The non-volatile memory device of claim 4, wherein the string sequence comprises an indication of a series of single strings in which to read for respective wordlines.

6. The non-volatile memory device of claim 4, wherein the string sequence sequentially lists the plurality of strings.

7. The non-volatile memory device of claim 4, wherein the string sequence is indicative of a repeated sequence of strings.

8. A non-volatile memory device comprising:
    a memory block, the memory block including a plurality of wordlines, with each respective wordline including a plurality of strings; and
    one or more managing circuits in communication with the memory block, the one or more managing circuits configured to:
        access a string sequence in which to read strings for the post-write read;
        iteratively perform:
            select a respective wordline;
            select, based on the accessed string sequence, a string;
            perform a post-write read for the selected respective wordline and the selected string, wherein the post-write read is performed on fewer than all of the strings for the selected respective wordline; and
            determine, for the respective wordline, whether there is a defect based on the post-write read performed on fewer than all of the strings for the selected respective wordline.

9. The non-volatile memory device of claim 8, wherein the one or more managing circuits is further configured to determine whether each of the plurality strings are defective.

10. The non-volatile memory device of claim 9, wherein the one or more managing circuits is configured to determine whether each of the plurality of strings are defective by:
    analyzing fewer than all of the post-write read for a respective string; and
    determining whether the respective string is defective based on the analysis of the fewer than all of the post-write read for a respective string.

11. The non-volatile memory device of claim 10, wherein the string sequence comprises an indication of a series of single strings in which to read for respective wordlines.

12. The non-volatile memory device of claim 11, wherein the string sequence sequentially lists the plurality of strings.

13. The non-volatile memory device of claim 11, wherein the string sequence repeats a sequence of strings.

14. A method for performing a post-write read in a memory device, the method comprising:
    iteratively performing:
        selecting a respective wordline;
        selecting a representative string from the plurality of strings;
        performing a post-write read for the selected respective wordline and the representative string, wherein the post-write read is performed on fewer than all of the strings for the selected respective wordline; and
        determining, for the respective wordline and based solely on the post-write read for the selected respective wordline and the representative string, whether there is a defect in the selected respective wordline.

15. The method of claim 14, further comprising determining whether each of the plurality strings are defective.

16. The method of claim 15, wherein determining whether each of the plurality of strings are defective by:
    analyzing fewer than all of the post-write read for a respective string; and
    determining whether the respective string is defective based on the analysis of the fewer than all of the post-write read for a respective string.

17. The method of claim 16, wherein selecting the representative string from the plurality of strings is based on a string sequence.

18. The method of claim 17, wherein the string sequence comprises an indication of a series of single strings in which to read for respective wordlines.

19. The method of claim 18, wherein the string sequence sequentially lists the plurality of strings.

20. The method of claim 18, wherein data is read from a set of wordlines are read at a same string; and
    wherein determining whether the same string defective is based on based on the data read from the plurality of wordlines are read at a same string.

21. The method of claim 20, wherein the plurality of wordlines is in a memory block; and
    wherein the set of wordlines is less than all of the wordlines in the memory block.

22. The non-volatile memory device of claim 1, further comprising post-write read determination circuitry configured to determine whether to perform a post-write read of at least a part of a memory block in the non-volatile memory device, the memory block including a plurality of wordlines, with each respective wordline including a plurality of strings; and wherein the post-write read circuitry is configured to perform the post write read in response to the post-write read determination circuitry determining to perform the post write read.

23. The non-volatile memory device of claim 8, wherein the one or more managing circuits is further configured to determine whether to perform a post-write read of at least a part of the memory block.

24. The method of claim 14, further comprising determining whether to perform the post-write read of at least a part of a memory in the memory device, wherein the memory includes a plurality of wordlines, with each respective wordline including a plurality of strings.

* * * * *